United States Patent
Kim (10) Patent No.: US 8,445,369 B2
(45) Date of Patent: May 21, 2013

(54) METHOD FOR FABRICATING SEMICONDUCTOR DEVICE

(75) Inventor: Baek-Mann Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 13/244,136

(22) Filed: Sep. 23, 2011

(65) Prior Publication Data
US 2012/0015509 A1    Jan. 19, 2012

Related U.S. Application Data

(62) Division of application No. 12/939,453, filed on Nov. 4, 2010, now Pat. No. 8,053,341.

(30) Foreign Application Priority Data

Feb. 26, 2010   (KR) .......................... 10-2010-0018170

(51) Int. Cl.
*H01L 21/265* (2006.01)
(52) U.S. Cl.
USPC .................................... 438/514; 257/E21.334

(58) Field of Classification Search
USPC .................................................. 438/514, 523
See application file for complete search history.

(56) References Cited

U.S. PATENT DOCUMENTS

| | | | |
|---|---|---|---|
| 6,362,042 B1 * | 3/2002 | Hosotani et al. | 438/253 |
| 6,734,479 B1 * | 5/2004 | Ogishima et al. | 257/296 |
| 7,419,865 B2 * | 9/2008 | Parekh et al. | 438/201 |
| 2002/0187598 A1 * | 12/2002 | Park et al. | 438/197 |
| 2008/0284029 A1 * | 11/2008 | Kim et al. | 257/758 |
| 2010/0200948 A1 * | 8/2010 | Kim | 257/520 |
| 2011/0070716 A1 * | 3/2011 | Kim | 438/386 |

* cited by examiner

*Primary Examiner* — Thao P. Le
(74) *Attorney, Agent, or Firm* — IP & T Group LLP (57) ABSTRACT

A method for fabricating a semiconductor device includes forming junction area for a bit line contact (BLC) and a junction area for a storage node contact (SNC) by performing ion implantation in a substrate having a buried gate; forming a first insulation pattern having an opening to expose the junction areas; forming a buffer layer to fill the openings; forming a second insulation pattern over the first insulation pattern after filling the openings, wherein the second insulation pattern has openings to expose the buffer layer in an area of the buffer layer that lies over the junction area for the SNC; and forming an SNC to fill the opening of the second insulation patterns.

9 Claims, 9 Drawing Sheets

METHOD FOR FABRICATING SEMICONDUCTOR DEVICE

CROSS-REFERENCE TO RELATED APPLICATIONS

This application is a division of U.S. patent application Ser. No. 12/939,453 filed on Nov. 4, 2010 and issued on Nov. 8, 2011 as U.S. Pat. No. 8,053,341, which claims priority of Korean patent application number 10-2010-0018170, filed on Feb. 26, 2010. The disclosure of each of the foregoing applications is incorporated herein by reference in its entirety.

BACKGROUND OF THE INVENTION

Exemplary embodiments of the present invention relate to semiconductor fabrication technology, and more particularly, to a method for fabricating a storage node contact plug of a semiconductor device including a buried gate.

In a typical gate structure, gates are formed on a substrate, a landing plug contact (LPC) is formed between the gates and coupled to a source/drain, and a storage node contact (SNC) is formed on the landing plug contact and couples a capacitor to the substrate.

As the size of semiconductor devices is being reduced, a buried gate structure is being used. In the buried gate structure, a trench is formed by etching a substrate and a gate is buried in the trench, instead of formed on the substrate.

A semiconductor device to which the buried gate is applied has such a structural characteristic that the LPC may be removed. Therefore, since a distance from a capacitor to a source/drain may be shortened, external resistance (Rext) may be reduced.

However, since the cross-sectional area of the SNC may be excessively reduced by the miniaturization of the device, the external resistance (Rext) may be still high.

SUMMARY OF THE INVENTION

An embodiment of the present invention is directed to a method for fabricating a semiconductor device, which is capable of reducing external resistance of a semiconductor device having a buried gate.

In accordance with an exemplary embodiment of the present invention, a method for fabricating a semiconductor device includes: forming junction area for a bit line contact (BLC) and a junction area for a storage node contact (SNC) by performing ion implantation in a substrate having a buried gate; forming a first insulation pattern having an opening to expose the junction areas; forming a buffer layer to fill the openings; forming a second insulation pattern over the first insulation pattern after filling the openings, wherein the second insulation pattern has openings to expose the buffer layer in an area of the buffer layer that lies over the junction area for the SNC; and forming an SNC to fill the opening of the second insulation pattern.

In accordance with another exemplary embodiment of the present invention, a method for fabricating a semiconductor device includes: forming a junction area for a bit line contact (BLC) and a junction area for a storage node contact (SNC) by performing ion implantation in a substrate having a buried gate; forming a bit line over the junction area for the BLC; forming an insulation layer to insulate the bit line over the substrate; forming a contact hole by etching the insulation layer, the contact hole opening exposing the junction areas for the SNC node of the junction area; forming a buffer layer to fill a portion of the contact hole; and forming an SNC plug over the buffer layer so as to fill contact hole.

DESCRIPTION OF SPECIFIC EMBODIMENTS

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

First Embodiment

FIGS. 1A to 1F are cross-sectional views explaining a method for fabricating a semiconductor device in accordance with a first embodiment of the present invention.

Figure 1A:
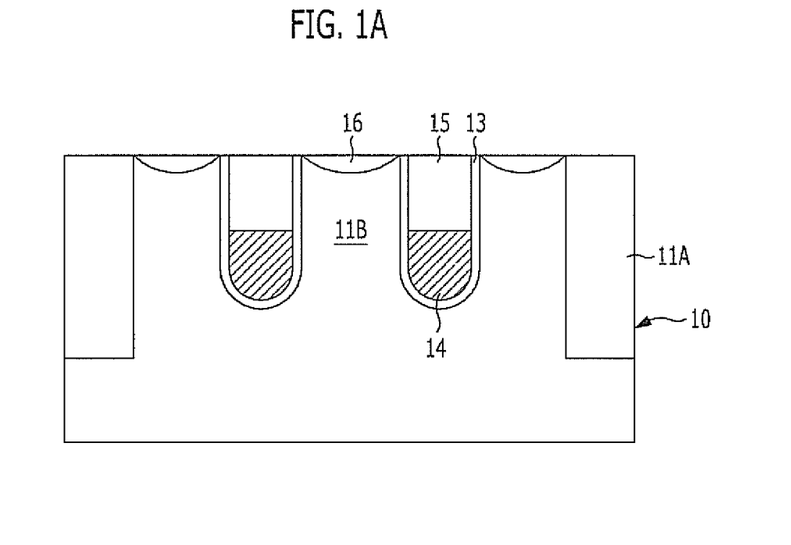
FIGS. 1A to 1F are cross-sectional views explaining a method for fabricating a semiconductor device in accordance with a first embodiment of the present invention.

Referring to FIG. 1A, an isolation layer 11A is formed on a substrate 10 through a shallow trench isolation (STI) process. The isolation layer 11A may include an oxide layer such as a high density plasma (HDP) oxide layer or a spin on dielectric (SOD) layer. An active area 11B is defined by the isolation layer 11A.

A buried gate 14 is formed in the substrate 10. More specifically, the buried gate 14 may be formed by the following process. First, the substrate 10 is etched to a desired depth to form a trench 12. The trench 12 is used for forming the buried gate 14. A mask pattern for opening a buried-gate area is formed over the substrate 10, and the substrate 10 is etched by using the mask pattern as an etching barrier to form the trench 12. As the mask pattern, a mask pattern used for forming the isolation layer 11A may be used as it is.

A gate dielectric layer 13 is formed on the side walls and bottom surface of the trench 12. The gate dielectric layer 13 may be formed by oxidizing the surface of the trench 12. The oxidation process for the surface of the trench 12 may be performed by applying an oxidation process for a typical gate dielectric layer. For example, a thermal oxidation process or a radical oxidation process may be performed independently. Alternatively, the thermal oxidation process and the radical oxidation process may be combined to perform the oxidation process. Since the substrate 10 is a silicon substrate, a silicon oxide layer ($Si_xO_y$) may be formed by the oxidation process. Meanwhile, the silicon oxide layer formed by the oxidation process may be nitrided in a subsequent process.

A conductive material is deposited over the entire surface of the substrate 10 to fill the trench 12 in which the gate dielectric layer 13 is formed, and a planarization process is performed in such a manner that the surface of the mask pattern used for forming the trench 12 is exposed. The conductive material is recessed through an etch back process, and the buried gate 14 is formed to fill a portion of the trench 12.

At this time, the conductive material includes a metal layer. Furthermore, the conductive material may include a structure selected from the group consisting of a single layer of titanium nitride (TiN), a multilayer of titanium nitride (TiN) and tungsten (W), and a multilayer of tantalum nitride (TaN) and tungsten (W). The planarization process may include a chemical mechanical polishing (CMP) process.

A capping layer 15 is formed on the entire surface of the buried gate 14 until the rest portion of the trench 12 is gap-filled, and etching is performed in such a manner that the capping layer 15 remains only in the trench 12. The capping layer 15 has an excellent gap-fill property and serves as a protective layer for substantially preventing the buried gate 14 from being oxidized by heat in a subsequent process. The capping layer 15 may be formed of oxide or nitride. The oxide layer may include a SOD layer having an excellent gap-fill property, particularly, the SOD layer made of polysilazane, and the nitride layer may include a silicon nitride layer. The capping layer 15 may be formed of oxide, in order to substantially prevent the degradation of a transistor caused by dynamic stress.

Source/drain areas 16 are formed by performing ion implantation in the substrate at both sides of the buried gate 14. At this time, the source/drain area 16 between the buried gates 14 is used as a bit line contact (BLC) node, and the source/drain area 16 between the buried gate 14 and the isolation layer 11A is used as an SNC node.

Figure 1B:
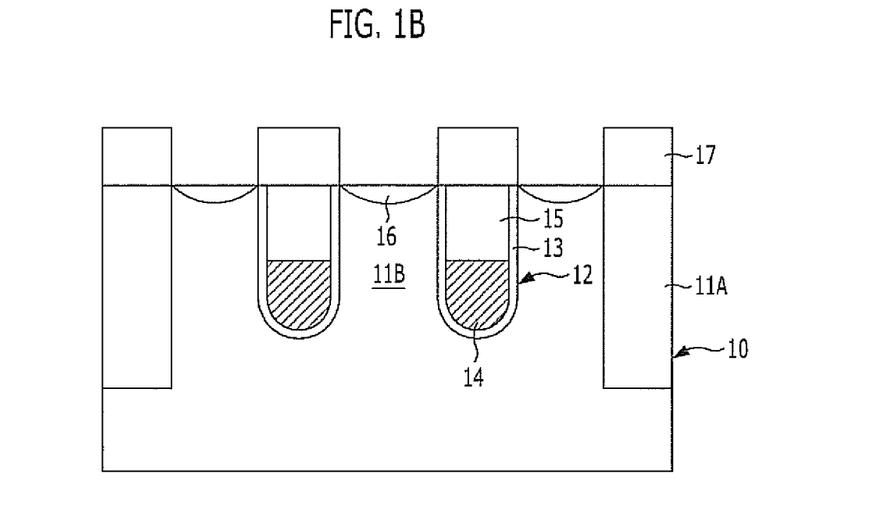

Referring to FIG. 1B, a first insulation pattern 17 is formed on the substrate 10 including the buried gate 14 such that the source/drain layer 16 is exposed through the first insulation pattern 17. The first insulation pattern 17 is formed by the following process: a first insulation layer is formed on the substrate 10 and then patterned to expose the source/drain area 16.

The first insulation pattern 17 is used for interlayer insulation, and may be formed of an insulating material including oxide. Furthermore, the first insulation pattern 17 may be formed in the same thickness as the thickness of a buffer layer which is to be formed in a subsequent process. For example, when the buffer layer to be subsequently formed has a thickness of 50 Å to 1,000 Å, the first insulation pattern 17 may also be formed in a thickness of 50 Å to 1,000 Å.

Figure 1C:
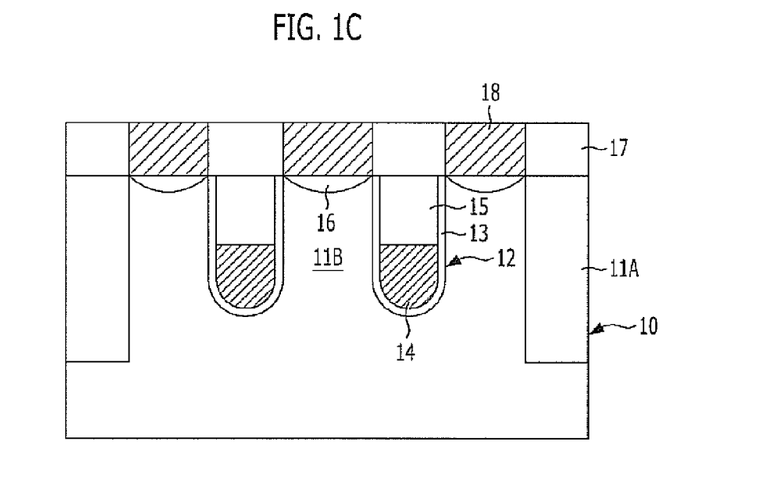

Referring to FIG. 1C, the buffer layer 18 is formed between the first insulation patterns 17. The buffer layer 18 serves to substantially prevent a subsequently formed SNC from being directly coupled to the substrate 10 so that an increase of leakage current and a reduction in refresh characteristic may be prevented.

In order to form the buffer layer 18, polysilicon is formed/deposited to sufficiently fill the space between the first insulation patterns 17, and a planarization process is performed in such a manner that the surface of the first insulation pattern 17 is exposed, that is, the polysilicon is isolated by the first insulation pattern 17. At this time, a CMP process may be performed as the planarization process. Alternatively, the buffer layer 18 may be formed by growing silicon to a desired thickness from the substrate 10 through a silicon epitaxial growth (SEG) process.

The buffer layer 18 may be formed to have a thickness so that its resistance is not significantly increased while leakage current is reduced due to prevention of a direction connection of a subsequently formed SNC to the substrate 10. For example, the buffer layer 18 is formed to have the same thickness as that of the first insulation pattern 17, that is, 50 Å to 1,000 Å.

In order to reduce the resistance of the device, the subsequently formed SNC may be formed of a metallic material having low specific resistance. In this case, when the metallic material is directly coupled to the source/drain area 16 of the substrate 10, an increase of leakage current and a reduction/degradation in refresh characteristic may occur.

In the exemplary embodiment of the present invention, as the buffer layer 18 made of polysilicon is formed on the source/drain area 16, the subsequent metal material may be substantially prevented from being directly coupled to the substrate 10. Accordingly, a leakage current increase may be substantially prevented, and proper refresh characteristics may be obtained.

Figure 1D:
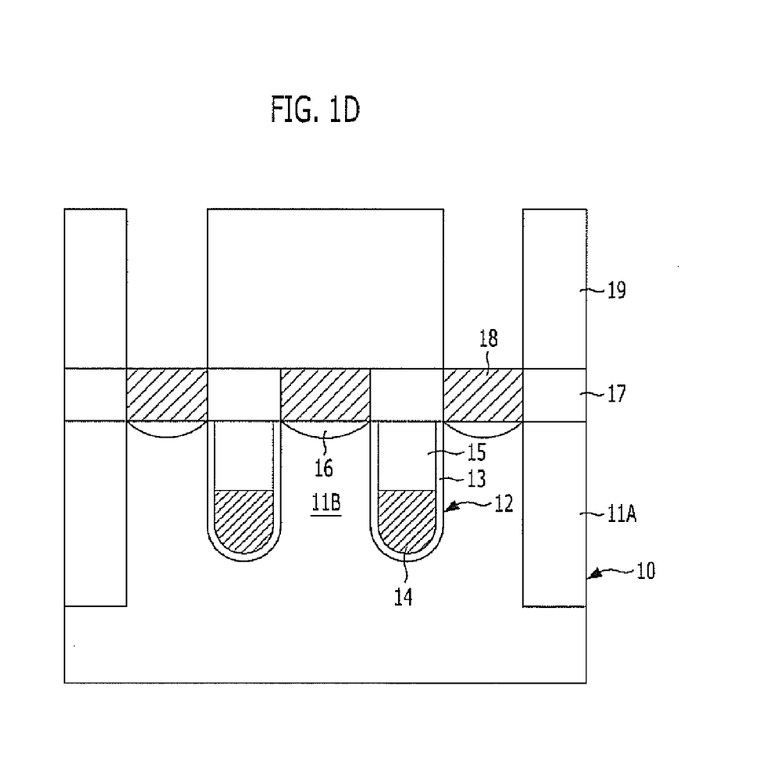

Referring to FIG. 1D, a second insulation pattern 19 is formed on the first insulation pattern 17 including the buffer layer 18. The second insulation pattern 19 is used for interlayer insulation, and may be formed of an insulating material including oxide.

The second insulation pattern 19 is formed by the following process. An insulating material of layer is formed on the first insulation pattern 17 including the buffer layer 18, and then etched in such a manner that the buffer layer 18 to be coupled to an SNC node in the source/drain area 16 of the substrate 10 is opened.

Figure 1E:
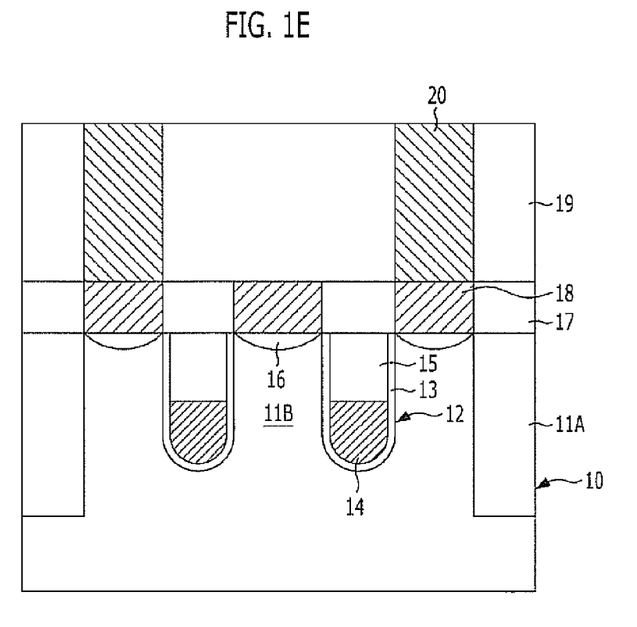

Referring to FIG. 1E, a metallic material is buried between the second insulation patterns 19 over the buffer layer 18 to form an SNC 20.

More specifically, the SNC 20 is formed by the following process. A metallic material is buried to a desired thickness to sufficiently fill the space over the buffer layer 18 between the second insulation patterns 19, and planarized in such a manner that the surface of the second insulation pattern 19 is exposed.

At this time, a metal layer may be formed to have such a desired thickness so as to be in contact with the buffer layer 18 before the metallic material is formed. The metal layer is not illustrated in FIG. 1E. The metal layer may be formed of metal or metal silicide, and have a thickness of 10 Å to 500 Å.

The metal layer may include a structure including one or more layers selected from the group consisting of a Ti layer, a TiN layer, Ta layer, TaN layer, and WN layer. Alternatively, the metal layer may be formed of a metal silicide selected from the group consisting of titanium silicide, cobalt silicide, nickel silicide, and tungsten silicide.

Furthermore, the metallic material for forming the SNC 20 may include TiN or W.

As the planarization process for isolating the SNC 20, a dry etching process or a CMP process may be performed, or a dry etching process and a CMP process may be performed in combination with each other.

Figure 1F:
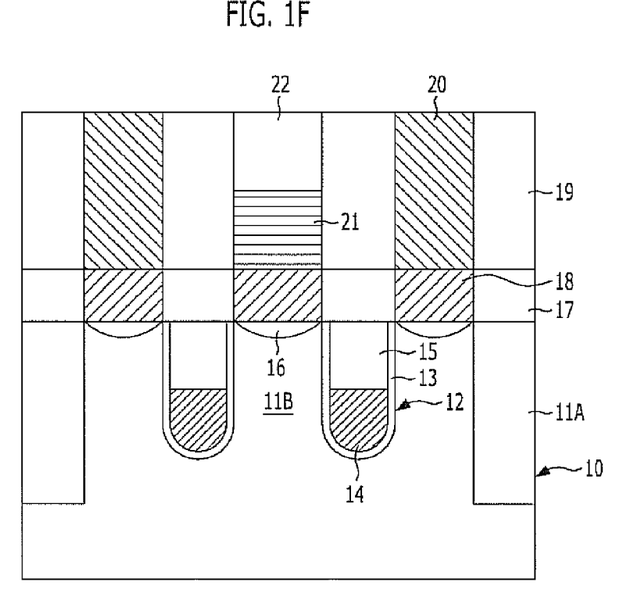

Referring to FIG. 1F, the second insulation pattern 20 is etched to form a contact hole which opens the buffer layer 18 to be coupled to the BLC node in the source/drain area 16 of the substrate 10. The contact hole is not illustrated in FIG. 1F.

A bit line is formed by burying a bit line electrode 21 and a bit line hard mask 22 in the contact hole.

More specifically, a metal layer is formed in the contact hole so as to be in contact with the buffer layer 18, and a metallic material which is to be used as an electrode is buried. The metal layer is not illustrated in FIG. 1F. At this time, the metal layer includes a multilayer structure of titanium silicide and titanium nitride, and the metallic material includes a tungsten layer. Then, the bit line electrode 21 is formed by etching the metallic material to a desired depth through an etch back process.

An insulating material is formed on the bit line electrode 21 so as to fill the rest portion of the contact hole, and the bit line hard mask 22 is formed by planarizing the insulating material such that the surface of the second insulation pattern 19 is exposed. At this time, the insulating material may be formed of nitride, and the planarization process may include a CMP process.

In the exemplary embodiment of the present invention, the buffer layer 18 made of polysilicon is formed between the SNC 20 and the substrate 10, thereby reducing leakage current and improving a refresh characteristic. Furthermore, the SNC 20 is formed of a metallic material having low specific resistance, thereby reducing the resistance of the semiconductor device.

Second Embodiment

FIGS. 2A to 2F are cross-sectional views explaining a method for fabricating a semiconductor device in accordance with a second embodiment of the present invention.

Figure 2A:
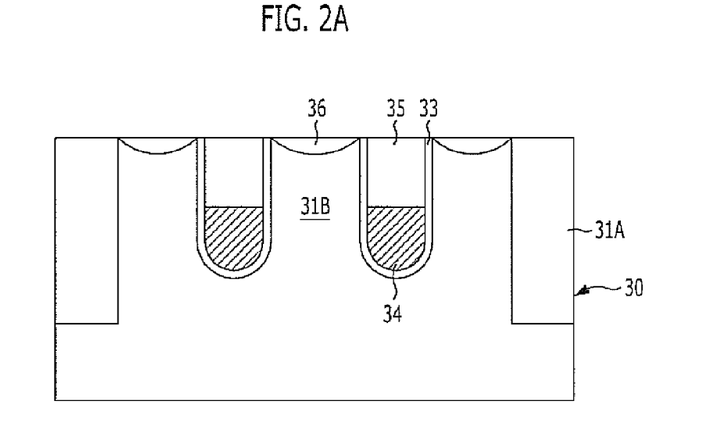
FIGS. 2A to 2F are cross-sectional views explaining a method for fabricating a semiconductor device in accordance with a second embodiment of the present invention.

Referring to FIG. 2A, an isolation layer 31A is formed on a substrate 30 through an STI process. The isolation layer 31A may include an oxide layer such as an HDP oxide layer or a SOD layer. An active area 31B is defined by the isolation layer 31A.

A buried gate 34 is formed in the substrate 30. More specifically, the buried gate 34 is formed by the following process. First, the substrate 30 is etched to a desired depth to form a trench 32. The trench 32 is used for forming the buried gate 34. A mask pattern for opening a buried-gate area is formed over the substrate 30, and the trench 32 is formed by etching the substrate 30 using the mask pattern as an etching barrier. As the mask pattern, a mask pattern used for forming the isolation layer 31A may be used as it is.

A gate dielectric layer 33 is formed on the sidewalls and bottom surface of the trench 32. The gate dielectric layer 33 may be formed by oxidizing the surface of the trench 32. As the oxidation process for the surface of the trench 32, an oxidation process for forming the gate dielectric layer may be applied. For example, a thermal oxidation process or a radical oxidation process may be performed independently. Alternatively, the thermal oxidation process and the radical oxidation process may be combined to perform the oxidation process. Since the substrate 30 is a silicon substrate, the silicon oxide layer ($Si_xO_y$) may be formed by the oxidation process. Meanwhile, the silicon oxide layer formed by the oxidation process may be nitrided in a subsequent process.

A conductive material is deposited over the entire surface of the substrate 30 so as to fill the trench 32 with the gate dielectric layer 33 already formed in the trench 32, and a planarization process is performed in such a manner that the surface of the mask pattern used for forming the trench 32 is exposed. The conductive material is recessed through an etch back process to form the buried gate 34 which fills a portion of the trench 32.

At this time, the conductive material includes a metal layer. Furthermore, the conductive material may include any structure selected from the group consisting of a single layer of TiN, a multilayer structure including a layer of TiN and a layer of W, and a multilayer structure including a layer of TaN and a layer of W. The planarization process may include a CMP process.

A capping layer 35 is formed on the entire surface of the buried gate 34 until the rest potion of the trench 32 is gap-filled, and etching is performed in such a manner that the capping layer 35 remains only in the trench 32. The capping layer 35 has an excellent gap-fill property and serves as a protective layer for substantially preventing the buried gate 34 from being oxidized by heat in a subsequent process. The capping layer 35 may be formed of oxide or nitride. The oxide layer may include an SOD layer having an excellent gap-fill property (e.g., the SOD layer made of polysilazane), and the nitride layer may include a silicon nitride layer. The capping layer 35 may be formed of oxide, in order to substantially prevent the degradation of a transistor caused by dynamic stress.

Source/drain areas 36 are formed by performing ion implantation in the substrate 30 at both sides of the buried gate 34. At this time, the source/drain area 36 between the buried gates 34 is used as a BLC node, and the source/drain area 36 between the buried gate 34 and the isolation layer 31A is used as an SNC node.

Figure 2B:
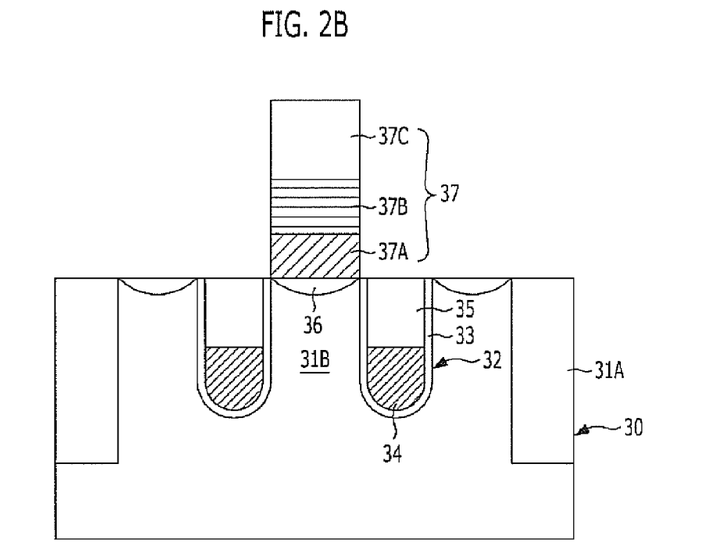

Referring to FIG. 2B, a bit line 37 is formed on the substrate 30. The bit line 37 is formed on the BLC node area between the buried gates 34.

The bit line 37 has a multilayer structure of a first electrode 37A, a second electrode 37B, and a bit line hard mask 37C. To form the bit line 37, a polysilicon layer, a metallic material layer, and a nitride layer are stacked on the substrate 30 including the buried gate 34, and patterning is performed. The patterned polysilicon layer becomes the first electrode 37A, the metallic material layer becomes the second electrode 37B, and the patterned nitride layer becomes the bit line hard mask 37C.

In particular, before the metallic material layer for the second electrode 37B is formed, a barrier metal layer may be formed on the polysilicon layer. The barrier metal layer serves to substantially prevent diffusion of the metallic material layer, and may have a multilayer structure of titanium silicide and titanium nitride. Furthermore, the metallic material layer may include a tungsten layer.

Figure 2C:
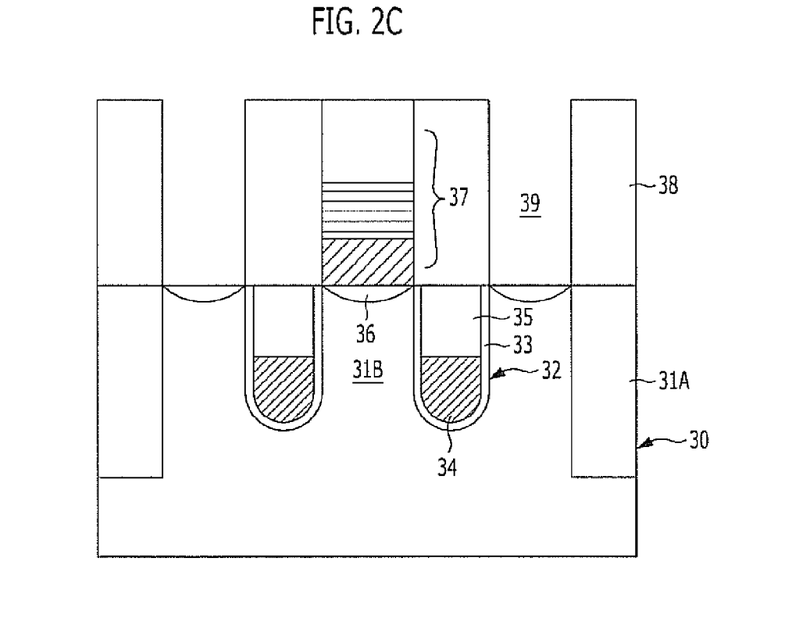

Referring to FIG. 2C, an insulation pattern 38 is formed on the substrate 30 including the buried gate 34. The insulation pattern 38 exposes the source/drain area 36 of the SNC node area, while filling the space between the bit lines 37. The insulation pattern 38 is formed by the following process. First, an insulation layer is formed to sufficiently fill the space between the bit lines 37 over the substrate 30 including the buried gate 34, and a contact hole 39 is formed by etching the insulation layer such that the source/drain area 36 of the SNC node area is exposed.

The insulation pattern 38 is used for insulation between the bit lines 37 and interlayer insulation, and may be formed of an insulating material. The insulating material includes oxide.

Figure 2D:
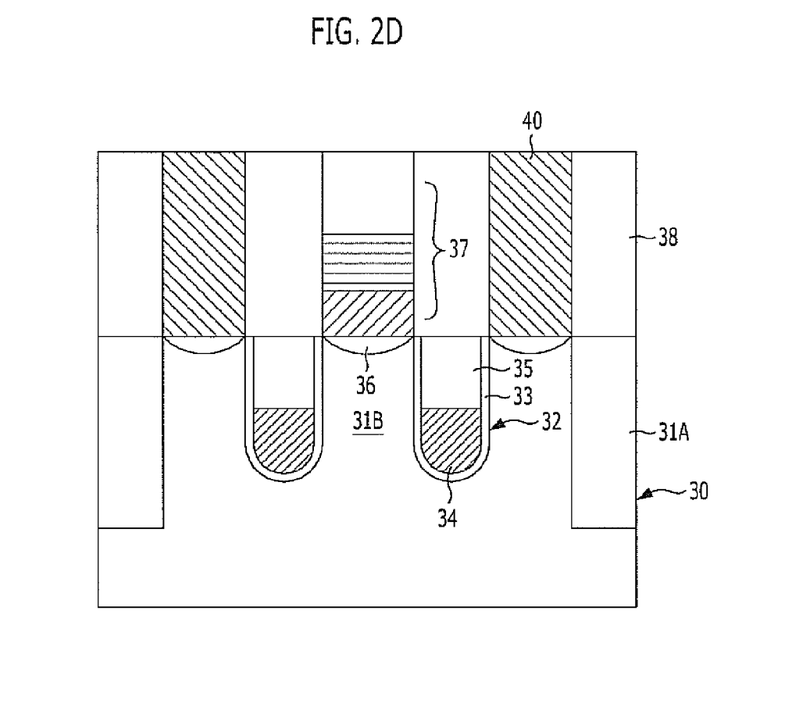

Referring to FIG. 2D, a conductive material 40 is formed to fill the contact hole 39 between the insulation patterns 38. The conductive material 40 is used for forming a buffer layer which substantially prevents a subsequently formed SNC from being directly coupled to the substrate 30.

The conductive material 40 may be formed of polysilicon. Polysilicon is formed to have a thickness to sufficiently fill the contact hole 39 between the insulation patterns 38, and a planarization process is performed in such a manner that the surface of the insulation pattern 38 is exposed. As the planarization process, a dry etching process or a CMP process may be performed.

Figure 2E:
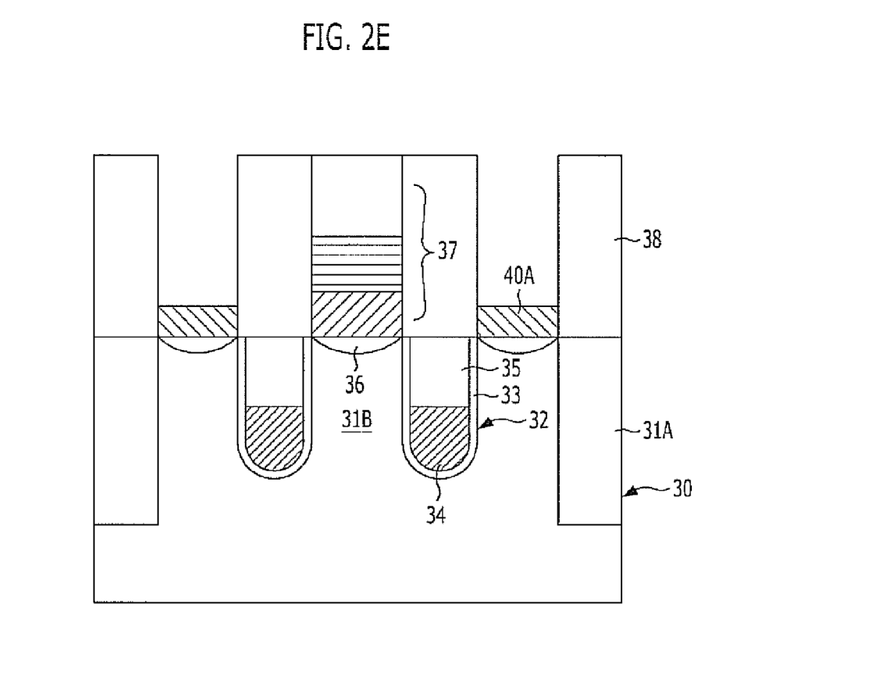

Referring to FIG. 2E, the conductive material 40 is etched by a desired depth in the contact hole 39. Hereafter, the remaining conductive material 40 is referred to as a buffer layer 40A.

The buffer layer 40A serves to substantially prevent a subsequently formed SNC from being directly coupled to the substrate 30, and may be formed to have a thickness so that leakage current is reduced while its resistance is not significantly increased. For example, the buffer layer 40A may be formed to have a thickness of 50 Å to 1,000 Å.

To reduce the resistance of the device, the subsequently formed SNC may be formed of a metallic material having low specific resistance. In this case, if the metallic material is directly coupled to the source/drain area 36 of the substrate 30, an increase of leakage current and a degradation in refresh characteristics may occur.

Thus, in the exemplary embodiment of the present invention, as the buffer layer 40A made of polysilicon is formed on the source/drain area 36, the subsequent metal material is prevented from being directly coupled to the substrate 30. Accordingly, a leakage current may be substantially prevented from being increased, and proper refresh characteristics may be obtained.

Figure 2F:
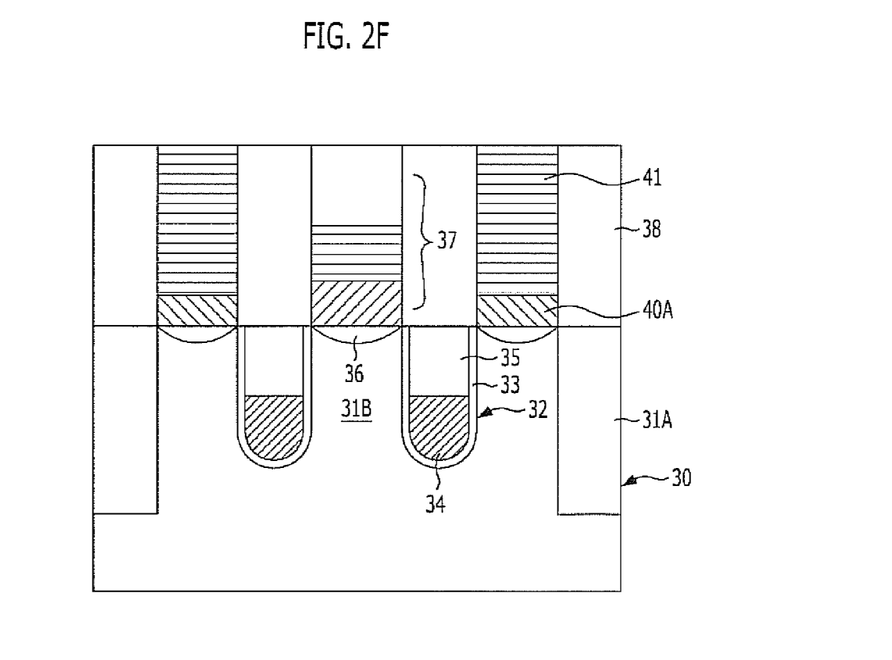

Referring to FIG. 2F, an SNC 41 is formed by burying a metallic material in the rest portion of the contact hole 39 over the buffer layer 40A.

More specifically, the SNC 41 is formed by the following process. The metallic material is formed in such a thickness as to sufficiently fill the contact hole 39 over the buffer layer 40A between the insulation patterns 38, and then planarized in such a manner that the surface of the insulation pattern 38 is exposed.

At this time, a metal layer may be formed with a certain thickness so as to be in contact with the buffer layer 40A, before the metallic material is formed. The metal layer may be formed of metal or metal silicide and have a thickness of 10 Å to 500 Å.

The metal layer may include a structure including one or more layers selected from the group consisting of a Ti layer, a TiN layer, a Ta layer, a TaN layer, and a WN layer. Alternatively, the metal layer may be formed of a metal silicide selected from the group consisting of titanium silicide, cobalt silicide, nickel silicide, and tungsten silicide.

Furthermore, the metallic material for forming the SNC 41 may include TiN or W.

As the planarization process for isolating the SNC 41, a dry etching process or a CMP process may be performed, or a dry etching process and a CMP process may be performed in combination with each other.

In the exemplary embodiment of the present invention, the buffer layer 40A made of polysilicon is formed between the SNC 41 and the substrate 30, thereby reducing leakage current and improving a refresh characteristic. Furthermore, the SNC 41 is formed of a metallic material having low specific resistance, thereby reducing the resistance of the semiconductor device.

Third Embodiment

FIGS. 3A to 3E are cross-sectional views explaining a method for fabricating a semiconductor device in accordance with a third embodiment of the present invention.

Figure 3A:
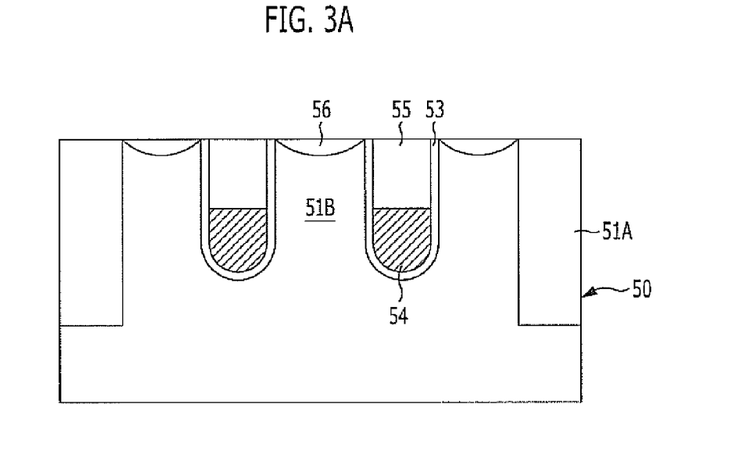
FIGS. 3A to 3E are cross-sectional views explaining a method for fabricating a semiconductor device in accordance with a third embodiment of the present invention.

Referring to FIG. 3A, an isolation layer 51A is formed on a substrate 50 through an STI process. The isolation layer 51A may include an oxide layer such as a HDP oxide layer or a SOD layer. An active area 51B is defined by the isolation layer 51A.

A buried gate 54 is formed in the substrate 50. More specifically, the buried gate 54 is formed by the following process. First, the substrate 50 is etched to a desired depth to form a trench 52. The trench 52 is used for forming the buried gate 54. A mask pattern for opening a buried-gate area is formed over the substrate 50, and the trench 52 is formed by etching the substrate 50 using the mask pattern as an etching barrier. As the mask pattern, a mask pattern used for forming the isolation layer 51A may be used as it is.

A gate dielectric layer 53 is formed on the sidewalls and bottom surface of the trench 52. The gate dielectric layer 53 may be formed by oxidizing the surface of the trench 52. As for the oxidation process for the surface of the trench 52, an oxidation process for forming the gate dielectric layer may be applied. For example, a thermal oxidation process or a radical oxidation process may be performed independently. Alternatively, the thermal oxidation process and the radical oxidation process may be combined to perform the oxidation process. Since the substrate 50 is a silicon substrate, the silicon oxide layer ($Si_xO_y$) may be formed by the oxidation process. Meanwhile, the silicon oxide layer formed by the oxidation process may be nitrided in a subsequent process.

A conductive material is deposited over the entire surface of the substrate 50 so as to fill the trench 52 having the gate dielectric layer 53 already formed, and a planarization process is performed in such a manner that the surface of the mask pattern used for forming the trench 52 is exposed. The conductive material is recessed through an etch back process to form the buried gate 54 which fills a portion of the trench 52.

At this time, the conductive material includes a metal layer. Furthermore, the conductive material may include any structure selected from the group consisting of a single layer of TiN, a multilayer of TiN and W, and a multilayer of TaN and W. The planarization process may include a CMP process.

A capping layer 55 is formed on the entire surface of the buried gate 54 until the rest potion of the trench 52 is gap-filled, and etching is performed in such a manner that the capping layer 55 remains only in the trench 52. The capping layer 55 has an excellent gap-fill property and serves as a protective layer for substantially preventing the buried gate 54 from being oxidized by heat in a subsequent process. The capping layer 55 may be formed of oxide or nitride. The oxide layer may include a SOD layer having an excellent gap-fill property, particularly, the SOD layer made of polysilazane, and the nitride layer may include a silicon nitride layer. The capping layer 55 may be formed of oxide, in order to substantially prevent the degradation of a transistor caused by dynamic stress.

Source/drain areas 56 are formed by performing ion implantation in the substrate 50 at both sides of the buried gate 54. At this time, the source/drain area 56 between the buried gates 54 is used as a BLC node, and the source/drain area 56 between the buried gate 54 and the isolation layer 51A is used as an SNC node.

Figure 3B:
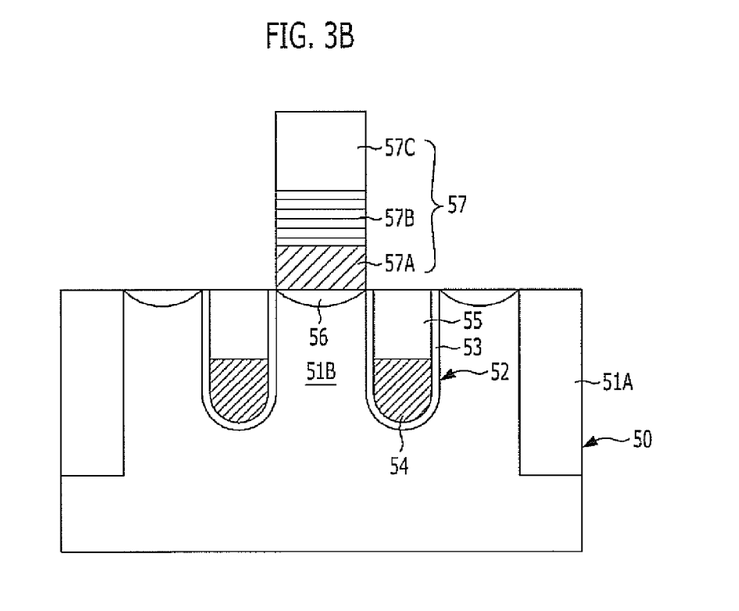

Referring to FIG. 3B, a bit line 57 is formed on the substrate 50. The bit line 57 is formed on the BLC node area between the buried gates 54.

The bit line 57 has a multilayer structure having a first electrode 57A, a second electrode 57B, and a bit line hard mask 57C. To form the bit line 57, a polysilicon layer, a metallic material layer, and a nitride layer are stacked on the substrate 50 including the buried gate 54, and patterning is performed. The patterned polysilicon layer becomes the first electrode 57A, the metallic material layer becomes the second electrode 57B, and the patterned nitride layer becomes the bit line hard mask 57C.

In particular, before the metallic material layer for the second electrode 57B is formed, a barrier metal layer may be formed on the polysilicon layer. The barrier metal layer serves to substantially prevent diffusion of the metallic material layer, and may have a multilayer structure of titanium silicide and titanium nitride. Furthermore, the metallic material layer may include a tungsten layer.

Figure 3C:
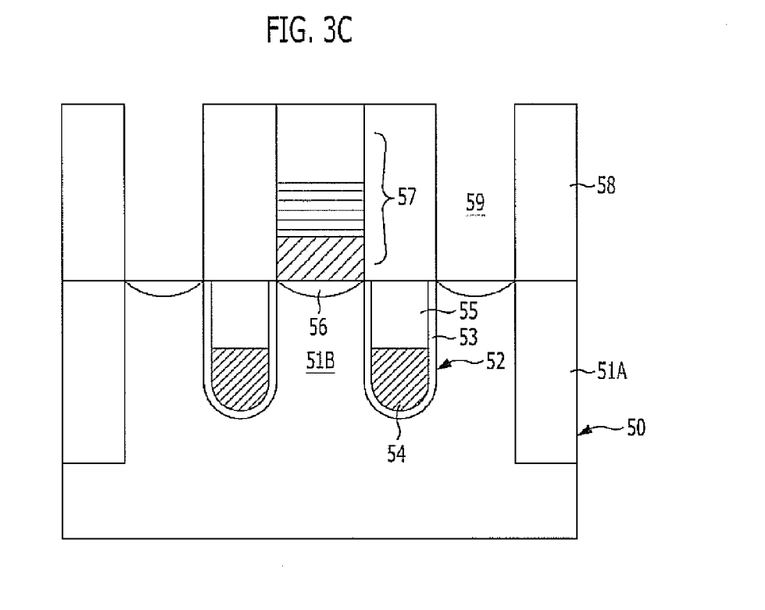

Referring to FIG. 3C, an insulation pattern 58 is formed on the substrate 50 including the buried gate 54. The insulation pattern 58 exposes the source/drain area 56 of the SNC node area, while filling the space between the bit lines 57. The insulation pattern 58 is formed by the following process. First, an insulation layer is formed to sufficiently fill the space between the bit lines 57 over the substrate 50 including the buried gate 54, and a contact hole 59 is formed by etching the insulation layer such that the source/drain area 56 of the SNC node area is exposed.

The insulation pattern 58 is used for insulation between the bit lines 57 and interlayer insulation, and may be formed of an insulating material. The insulating material includes oxide.

Figure 3D:
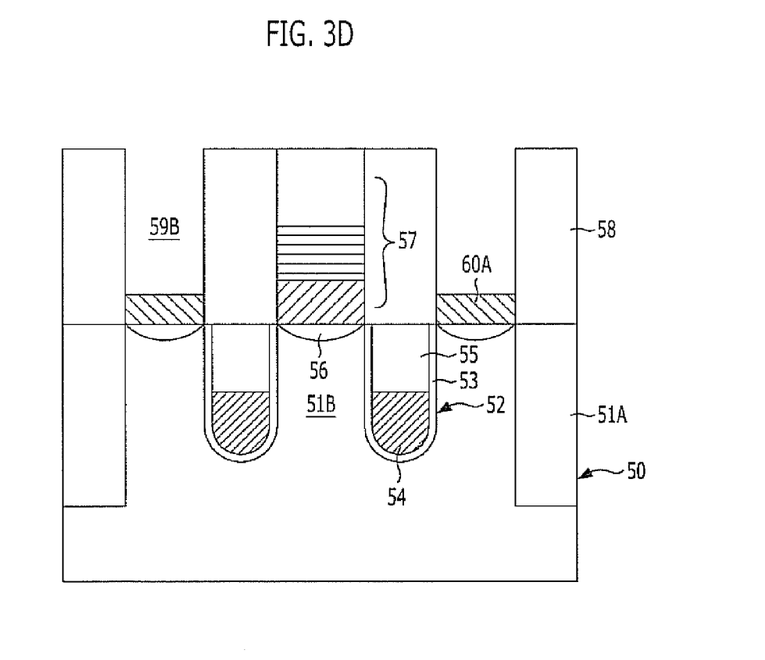

Referring to FIG. 3D, a buffer layer 60A is formed at the source/drain area (SNC node area) 56 of the substrate 50 which is opened through the contact hole 59. The buffer layer 60A is formed by growing silicon to have a desired thickness from the substrate through a silicon epitaxial growth (SEG) process.

The buffer layer 60A may be formed to have a thickness so that its resistance is not significantly increased while leakage current is reduced by preventing a subsequently formed SNC from being directly coupled to the substrate 50. For example, the buffer layer 60A may be formed in a thickness of 50 Å to 1,000 Å.

In order to reduce the resistance of the device, the subsequently formed SNC may be formed of a metallic material having low specific resistance. In this case, when the metallic material is directly coupled to the source/drain area 56 of the substrate 50, an increase of leakage current and a reduction/degradation in refresh characteristic may occur.

In the exemplary embodiment of the present invention, as the buffer layer 60A made of polysilicon is formed on the source/drain area 56, a subsequent metal material may be prevented from being directly coupled to the substrate 50. Accordingly, a leakage current increase may be substantially prevented, and proper refresh characteristics may be obtained.

Figure 3E:
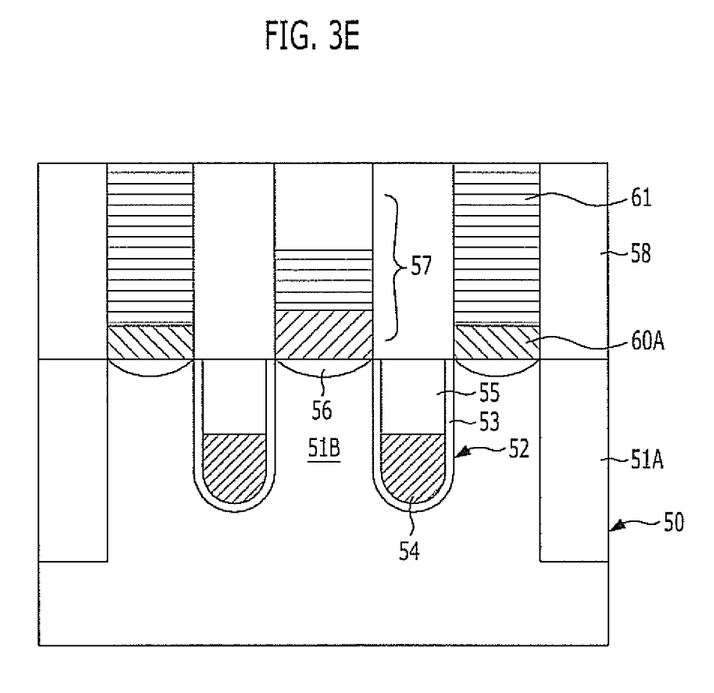

Referring to FIG. 3E, a metallic material is formed to fill the rest portion of the contact hole 59B over the buffer layer 60A, thereby forming an SNC 61.

More specifically, the SNC 61 is formed by the following process. The metallic material is buried to have such a thickness as to sufficiently fill the contact hole 59B between the insulation patterns 58 over the buffer layer 60A, and then planarized in such a manner that the surface of the insulation pattern 58 is exposed.

At this time, a metal layer may be formed to have a desired thickness so as to be in contact with the buffer layer 60A, before the metallic material is formed. The metal layer is not illustrated in FIG. 3E. The metal layer may be formed of metal or metal silicide, and have a thickness of 10 Å to 500 Å.

The metal layer includes one or more layers selected from the group consisting of a Ti layer, a TiN layer, a Ta layer, a TaN layer, and a WN layer. Alternatively, the metal layer may be formed of a metal silicide selected from the group consisting of titanium silicide, cobalt silicide, nickel silicide, and tungsten silicide.

Furthermore, the metallic material for forming the SNC 61 may include TiN or W.

As the planarization process for isolating the SNC 61, a dry etching process or a CMP process may be performed, or a dry etching process and a CMP process may be performed in combination with each other.

In the exemplary embodiment of the present invention, the buffer layer 60 made of polysilicon is formed between the SNC 61 and the substrate 50, thereby reducing leakage current and improving a refresh characteristic. Furthermore, the SNC 61 is formed of a metallic material having low specific resistance, thereby reducing the resistance of the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a junction area for a bit line contact (BLC) and a junction area for a storage node contact (SNC) by performing ion implantation in a substrate having a buried gate;
    forming a bit line over the junction area for the BLC;
    forming an insulation layer to insulate the bit line over the substrate;
    forming a contact hole by etching the insulation layer, the contact hole exposing the junction area for the SNC;
    forming a buffer layer to fill a portion of the contact hole so as to cover the entire bottom surface of the contact hole and cover the entire exposed junction area for the SNC; and
    forming a SNC plug over the buffer layer so as to fill contact hole,
    wherein the buffer layer is formed of a conductive layer.

2. The method of claim 1, wherein the insulation layer is formed of oxide.

3. The method of claim 1, wherein the forming of the buffer layer comprises:
    forming a polysilicon layer to fill the contact hole; and
    etching the polysilicon layer to form the buffer layer that fills the portion of the contact hole.

4. The method of claim 1, wherein the forming of the buffer layer comprises growing silicon from the substrate through a silicon epitaxial growth (SEG) process such that the portion of the contact hole is filled.

5. The method of claim 1, wherein the SNC plug is formed of a metallic material.

6. The method of claim 1, wherein the SNC plug is formed by stacking a barrier metal layer and a metallic material.

7. The method of claim 6, wherein the barrier metal layer is composed of one or more layers selected from the group consisting of a metal layer, a metal nitride layer, and a metal silicide layer.

8. The method of claim 5, wherein the metallic material comprises TiN or W.

9. The method of claim 6, wherein the metallic material comprises TiN or W.

* * * * *